(12) United States Patent
Robinson et al.

(10) Patent No.: US 7,317,618 B2
(45) Date of Patent: Jan. 8, 2008

(54) COMBINED BOARD LEVEL SHIELDING AND THERMAL MANAGEMENT

(75) Inventors: Kenneth M. Robinson, Effort, PA (US); James E. Kline, Blairstown, NJ (US)

(73) Assignee: Laird Technologies, Inc., St. Louis, MO (US)

( * ) Notice: Subject to any disclaimer, the term of this patent is extended or adjusted under 35 U.S.C. 154(b) by 44 days.

(21) Appl. No.: 11/415,460

(22) Filed: May 1, 2006

(65) Prior Publication Data

US 2007/0211436 A1    Sep. 13, 2007

Related U.S. Application Data

(60) Provisional application No. 60/780,795, filed on Mar. 9, 2006.

(51) Int. Cl.
*H05K 7/20* (2006.01)
(52) U.S. Cl. ............... 361/719; 361/704; 361/709; 361/818; 165/80.3; 174/16.3; 174/384
(58) Field of Classification Search ............... 361/688, 361/690, 704–712, 714–722, 769, 783, 809, 361/816, 818, 752, 753, 796, 799; 165/80.2, 165/80.3, 80.4, 185; 174/16.3, 35 R, 35 GC, 174/50, 51; 257/706–727; 206/719; 439/70–73, 439/92, 95, 108, 607, 487
See application file for complete search history.

(56) References Cited

U.S. PATENT DOCUMENTS

| 3,047,648 | A | 7/1962 | Mowatt |
|---|---|---|---|
| 3,208,511 | A | 9/1965 | McAdam |
| 3,572,428 | A | 3/1971 | Monaco |
| 3,721,746 | A | 3/1973 | Knappenberger |
| 4,203,488 | A | 5/1980 | Johnson et al. |
| 4,235,285 | A | 11/1980 | Johnson et al. |
| 4,345,267 | A | 8/1982 | Corman et al. |
| 4,405,961 | A | 9/1983 | Chow et al. |
| 4,433,886 | A | 2/1984 | Cassarly et al. |
| 4,481,525 | A | 11/1984 | Calabro et al. |

(Continued)

FOREIGN PATENT DOCUMENTS

EP    0632686    8/1996

(Continued)

*Primary Examiner*—Michael Datskovskiy
(74) *Attorney, Agent, or Firm*—Harness, Dickey & Pierce, P.L.C.

(57) ABSTRACT

An exemplary apparatus generally includes a fence, a heat sink, and a thermal interface. The fence includes walls defining at least one opening along an upper portion of the fence. The walls are configured to be disposed generally about one or more electrical components of a board. The heat sink includes resilient fingers connected to a lid portion, and configured to engage openings of the fence and/or the board. The lid portion is configured to substantially entirely cover the at least one opening of the fence for cooperatively shielding the one or more electrical components within the interior defined by the lid portion and the fence's walls. The thermal interface is configured such that engagement of the resilient fingers with the openings compresses the thermal interface between the lid portion and the one or more electrical components, thereby forming a thermally-conducting heat path from the one or more electrical components to the heat sink.

16 Claims, 18 Drawing Sheets

U.S. PATENT DOCUMENTS

| | | | |
|---|---|---|---|
| 4,508,163 A | 4/1985 | McCarthy | |
| 4,661,888 A | 4/1987 | Jewell et al. | |
| 4,679,118 A | 7/1987 | Johnson et al. | |
| 4,729,426 A | 3/1988 | Hinshaw | |
| 4,754,101 A | 6/1988 | Stickney et al. | |
| 4,933,746 A | 6/1990 | King | |
| 5,052,481 A | 10/1991 | Horvath et al. | |
| 5,060,114 A | 10/1991 | Feinberg et al. | |
| 5,130,888 A | 7/1992 | Moore | |
| 5,175,395 A | 12/1992 | Moore | |
| 5,175,613 A | 12/1992 | Barker, III et al. | |
| 5,208,731 A | 5/1993 | Blomquist | |
| 5,241,453 A | 8/1993 | Bright et al. | |
| 5,285,350 A | 2/1994 | Villaume | |
| 5,287,001 A | 2/1994 | Buchmann et al. | |
| 5,288,313 A | 2/1994 | Portner | |
| 5,295,043 A | 3/1994 | Beijer | |
| 5,329,426 A | 7/1994 | Villani | |
| 5,354,951 A | 10/1994 | Lange, Sr. et al. | |
| 5,357,404 A | 10/1994 | Bright et al. | |
| 5,365,399 A | 11/1994 | Kent et al. | |
| 5,367,433 A | 11/1994 | Blomquist | |
| 5,416,668 A | 5/1995 | Benzoni | |
| 5,485,037 A | 1/1996 | Marrs | |
| 5,524,908 A | 6/1996 | Reis | |
| 5,541,811 A * | 7/1996 | Henningsson et al. | 361/704 |
| 5,550,713 A | 8/1996 | Pressler et al. | |
| 5,552,635 A | 9/1996 | Kim et al. | |
| 5,566,052 A | 10/1996 | Hughes | |
| 5,640,047 A | 6/1997 | Nakashima | |
| 5,663,786 A | 9/1997 | Miyamori | |
| 5,706,579 A | 1/1998 | Ross | |
| 5,717,248 A * | 2/1998 | Neumann et al. | 257/718 |
| 5,717,577 A | 2/1998 | Mendolia et al. | |
| 5,763,824 A | 6/1998 | King et al. | |
| 5,804,875 A | 9/1998 | Remsburg et al. | |
| 5,811,050 A | 9/1998 | Gabower | |
| 5,866,943 A | 2/1999 | Mertol | |
| 5,893,409 A | 4/1999 | Kohler et al. | |
| 5,917,701 A | 6/1999 | Solberg | |
| 5,990,418 A | 11/1999 | Bivona et al. | |
| 6,005,186 A | 12/1999 | Bachman | |
| 6,025,991 A | 2/2000 | Saito | |
| 6,049,469 A * | 4/2000 | Hood et al. | 361/818 |
| 6,075,700 A | 6/2000 | Houghton et al. | |
| 6,122,167 A | 9/2000 | Smith et al. | |
| 6,166,918 A | 12/2000 | Olofsson et al. | |
| 6,178,097 B1 | 1/2001 | Hauk, Jr. | |
| 6,178,318 B1 | 1/2001 | Holmberg et al. | |
| 6,181,573 B1 | 1/2001 | Riet | |
| 6,195,267 B1 | 2/2001 | MacDonald, Jr. et al. | |
| 6,205,026 B1 | 3/2001 | Wong et al. | |
| 6,208,515 B1 | 3/2001 | Klein | |
| 6,212,073 B1 | 4/2001 | Yamaguchi | |
| 6,269,008 B1 | 7/2001 | Hsu | |
| 6,347,035 B1 | 2/2002 | Hamano et al. | |
| 6,377,472 B1 | 4/2002 | Fan | |
| 6,377,475 B1 | 4/2002 | Reis | |
| 6,388,189 B1 | 5/2002 | Onoue | |
| 6,410,846 B1 | 6/2002 | Benn, Jr. | |
| 6,430,043 B1 | 8/2002 | Osburn | |
| 6,445,583 B1 * | 9/2002 | Kline et al. | 361/704 |
| 6,490,173 B2 | 12/2002 | Perkins et al. | |
| 6,501,018 B2 | 12/2002 | Mayer | |
| 6,504,095 B1 | 1/2003 | Hoffstrom | |
| 6,545,871 B1 * | 4/2003 | Ramspacher et al. | 361/709 |
| 6,552,261 B2 * | 4/2003 | Shlahtichman et al. | 174/384 |
| 6,590,783 B2 | 7/2003 | Spratte et al. | |
| 6,624,432 B1 | 9/2003 | Gabower et al. | |
| 6,673,998 B1 * | 1/2004 | Wu | 174/383 |
| 6,674,653 B1 | 1/2004 | Valentine | |
| 6,676,137 B2 | 1/2004 | Dean | |
| 6,744,640 B2 | 6/2004 | Reis et al. | |
| 6,943,287 B2 | 9/2005 | Lloyd et al. | |
| 6,946,598 B1 | 9/2005 | Konshak | |
| 6,949,706 B2 * | 9/2005 | West | 174/384 |
| 6,965,071 B2 | 11/2005 | Watchko et al. | |
| 6,979,773 B2 | 12/2005 | Fursich | |
| 6,989,994 B2 | 1/2006 | Maguire et al. | |
| 7,013,558 B2 | 3/2006 | Bachman | |
| 2001/0046119 A1 | 11/2001 | Hamano et al. | |
| 2003/0066672 A1 | 4/2003 | Watchko et al. | |
| 2004/0052064 A1 * | 3/2004 | Oliver et al. | 361/816 |
| 2005/0236171 A1 | 10/2005 | Garcia | |
| 2005/0237727 A1 | 10/2005 | Baker | |

FOREIGN PATENT DOCUMENTS

| | | |
|---|---|---|
| EP | 0910005 | 4/1999 |
| EP | 1364565 | 6/2002 |
| EP | 1 420 625 A2 * | 5/2004 |
| EP | 1493314 | 10/2006 |
| WO | WO 01/41521 | 6/2001 |
| WO | WO 02/069687 | 9/2002 |
| WO | WO 03/088729 | 10/2003 |

* cited by examiner

COMBINED BOARD LEVEL SHIELDING AND THERMAL MANAGEMENT

CROSS-REFERENCE TO RELATED APPLICATION

This application claims the benefit of U.S. Provisional Application 60/780,795 filed Mar. 9, 2006, the disclosure of which is incorporated herein by reference.

FIELD

The present disclosure generally relates (but not exclusively) to assemblies and methods capable of providing board level EMI shielding and heat dissipation for one or more electrical components of a board.

BACKGROUND

The statements in this background section merely provide background information related to the present disclosure and may not constitute prior art.

Electronic equipment include electrical components and circuits mounted on a substrate that can be sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, rendering the electronic equipment inefficient or inoperable. Accordingly, the circuits (sometimes referred to as RF modules or transceiver circuits) usually require EMI/RFI shielding in order to function properly. The shielding reduces interference not only from external sources, but also from various functional blocks within the module.

As used herein, the term "EMI" should be considered to generally include and refer to both EMI and RFI emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

By way of example, electronic circuits or components of a printed circuit board (PCB) are often covered with shields to localize EMI within its source, and to insulate other devices proximal to the EMI source. Such shields may be soldered or otherwise affixed to the PCB, thus increasing the overall size of the PCB. Soldered shields, however, may need to be removed to repair or replace the covered component, which can be an expensive and time consuming task that can even cause damage to the PCB.

In addition, many electronic components generate significant amounts of heat. Excessive heat build up can lead to reduced product life and reliability. Thus, various constructions have been proposed for removing heat generated by electronic components.

SUMMARY

According to various aspects, exemplary embodiments are provided of apparatus and assemblies capable of providing board level EMI shielding and heat dissipation for one or more electrical components of a board. Other aspects relate to components of combined EMI shielding and thermal management assemblies. Further aspects relate to methods of using combined EMI shielding and thermal management assemblies. Additional aspects relate to methods of making combined shielding and thermal management assemblies, and methods of making components thereof.

In one particular embodiment, an exemplary apparatus generally includes a fence, a heat sink, and a thermal interface. The fence includes walls defining at least one opening along an upper portion of the fence. The walls are configured to be disposed generally about one or more electrical components of a board. The heat sink includes resilient fingers connected to a lid portion. The resilient fingers are configured to engage openings of at least one of the fence and the board. The lid portion is configured to substantially entirely cover the at least one opening of the fence for cooperatively shielding the one or more electrical components within the interior defined by the lid portion and the fence's walls. The thermal interface is configured such that engagement of the resilient fingers with the openings compresses the thermal interface between the lid portion and the one or more electrical components, thereby forming a thermally-conducting heat path from the one or more electrical components to the heat sink.

Additional exemplary embodiments relate to methods of providing board level EMI shielding and dissipating heat from one or more electrical components of a board. In one such embodiment, a method generally includes positioning a fence relative to the board such that walls of the fence are disposed generally about the one or more electrical components. The method also includes engaging resilient fingers of a heat sink with openings of at least one of the fence and the board. The method further includes substantially entirely covering at least one opening defined along the upper portion of the fence with a lid portion of the heat sink such that the fence and the lid portion cooperatively shield the one or more electrical components within the interior defined by the lid portion and the fence's walls. A thermal interface can be positioned such that engagement of the resilient fingers with the openings compresses the thermal interface between the heat sink and the one or more electrical components, thereby forming a thermally-conducting heat path from the one or more electrical components to the heat sink.

Further exemplary embodiments include heat sinks that can be used with board level EMI shielding and heat dissipation assemblies. In one such embodiment, a heat sink generally includes a lid portion and resilient fingers connected to and extending at least partially around the lid portion. The lid portion is configured to substantially entirely cover at least one opening defined along an upper portion of a fence for cooperatively shielding one or more electrical components of a board that are disposed within the interior defined by the lid portion and the fence. The resilient fingers are configured for engaging corresponding openings of at least one of the fence and the board, to thereby generate a clamping force for biasing the heat sink generally towards the one or more electronic components.

Other exemplary embodiments include fences that can be used with board level EMI shielding and heat dissipation assemblies. In one such embodiment, a fence generally includes a plurality of walls defining at least one opening along an upper portion of the fence. The walls are configured to be disposed generally about one or more electrical components of a board. The fence can also include mounting feet for electrically contacting one or more traces of a board, notches between corresponding pairs of the mounting feet, and one or more resilient fingers extending generally inwardly from the walls. The fingers can have upwardly bent end portions for contacting an underside of a lid portion. When the lid portion is covering the at least one opening of the fence, the fence and the lid portion can cooperatively shield the one or more electrical components disposed within the interior defined by the fence's walls and the lid portion.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

Figure 16:
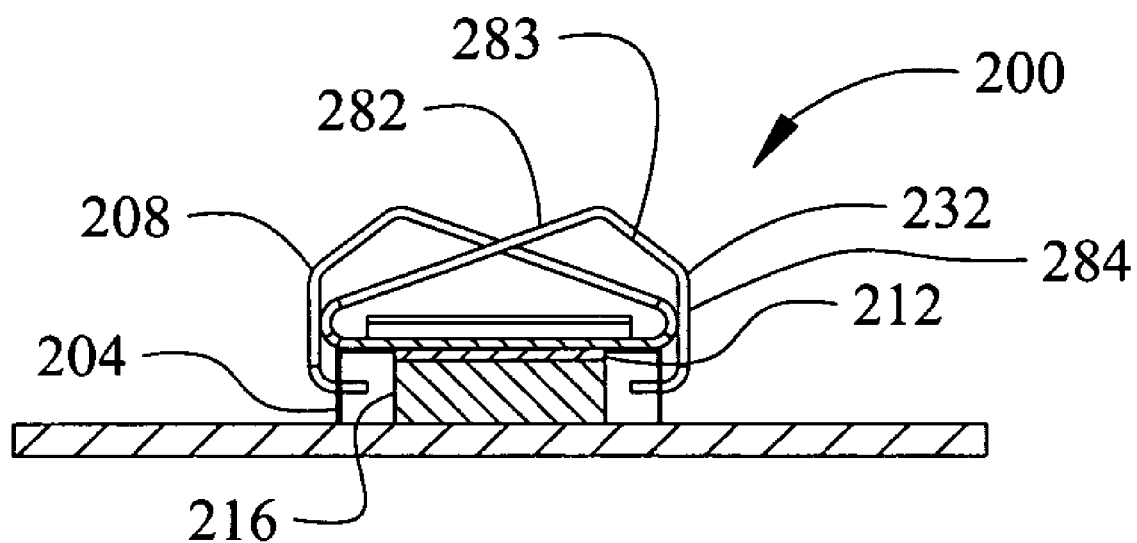
Figure 17:
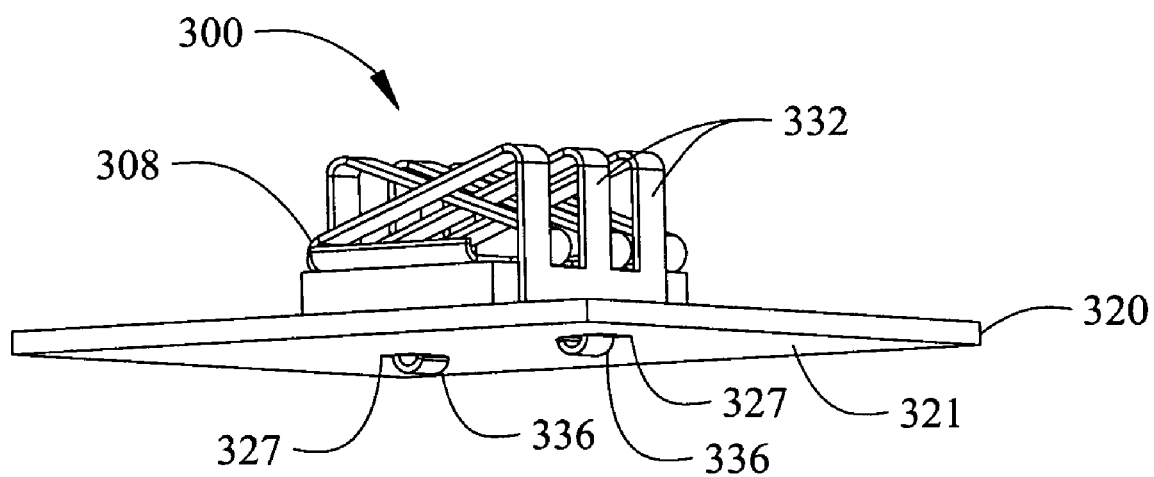

FIG. 16 is a cross-sectional view of an apparatus capable of providing board level EMI shielding and dissipating heat according to another exemplary embodiment and illustrating the apparatus disposed over a board-mounted electrical component; and FIG. 17 is a lower perspective view of an apparatus capable of providing board level EMI shielding and dissipating heat according to another exemplary embodiment and illustrating the apparatus disposed over an electrical component mounted to a board where the board includes openings engagingly receiving fingers of the heat sink.

DETAILED DESCRIPTION

The following description is merely exemplary in nature and is in no way intended to limit the present disclosure, application, or uses.

According to various aspects, exemplary embodiments are provided of assemblies capable of providing board level EMI shielding and heat dissipation for one or more electrical components of a board. Other aspects relate to components (e.g., fences, heat sinks, etc.) of combined EMI shielding and thermal management assemblies. Further aspects relate to methods of using combined EMI shielding and thermal management assemblies. Additional aspects relate to methods of making combined EMI shielding and thermal management assemblies, and methods of making the components thereof. Any of these aspects can be used individually or in combination with any one or more of the other aspects.

Various exemplary embodiments include assemblies operable for providing EMI shielding and thermal management. The apparatus generally includes a board level EMI shielding fence or frame for electrically grounding the apparatus to a board, such as a printed circuit board, etc. The apparatus also includes a structure for dissipating heat generated by the one or more electrical components of the board. The heat dissipation structure can also be generally referred to herein as a heat sink or heat spreader. The heat sink can cooperate with the fence to provide EMI shielding and thermal management (e.g., heat dissipation and cooling) for the electrical component(s) or package over which the apparatus is disposed. A thermal interface (e.g., a thermal interface material, a pad of thermally-conductive material, etc.) can be disposed generally between the heat sink and the electrical component(s) for forming a thermally-conducting heat path from the electrical component(s) to the heat sink, thereby facilitating the transfer of heat generated by the electrical component(s) to the heat sink.

In various embodiments, a fence includes one or more resilient or spring fingers for making contact with the heat sink. In other embodiments, the fence may also or alternatively include other means (e.g., EMI gasket materials, etc.) for contacting the heat sink. The fence may also include perimeter walls having mounting feet for contacting one or more traces of a board to establish or provide for electrical contact with the board. The fence perimeter walls can also include notches or other openings configured for engagingly receiving resilient fingers from the heat sink. Engagement of the heat sink's fingers within the fence's notches can generate a mechanical or clamping force for low thermal impedance and good positive thermal contact as the apparatus is compressed generally towards the top of the fence. Engagement of the heat sink's fingers within the notches can help retain contact between the heat sink and a thermal interface.

In various embodiments, a heat sink is configured for contacting both a fence and a thermal interface. In turn, the thermal interface can be configured such that the thermal interface is compressed against the one or more electrical components when the heat sink's fingers are engaged with openings of the fence or the board. This compression can help to create sufficient contact between the heat sink, thermal interface, and electrical component(s) for forming a good thermally-conducting heat path from the one or more electrical components to the heat sink, thereby providing the apparatus with good heat dissipation capacity.

A wide range of materials can be used for the various components of the apparatus. In one particular embodiment, the heat sink is made from sheet metal and has relatively long fingers. The relatively long fingers can provide relatively large heat dissipation or cooling surfaces. The fingers can also provide sufficient biasing or spring pressure for causing the heat sink to contact and compress the thermal interface against the electrical component(s). That is, the fingers (with their end portions engaged within notches of the fence perimeter walls or openings in the board, etc.) can apply suitable biasing or pressure for maintaining good thermal contact between the heat sink, thermal interface and electrical component(s).

In some embodiments, the biasing applied by the heat sink's fingers can also help the heat sink maintain good thermal and/or electrical contact with the fence. For example, the biasing force applied by the heat sink's fingers can firmly hold the heat sink down against the fence. This, in turn, can help reduce any gaps between the fence and the heat sink, thereby inhibiting electromagnetic energy from passing through or leaking out through the interface between the heat sink and the fence.

FIGS. 1 through 5 illustrate an exemplary combined EMI shielding and thermal management apparatus 100 embodying one or more aspects of the present disclosure. As shown, the apparatus 100 generally includes a fence 104, a heat sink 108, and a thermal interface 112.

Figure 1:
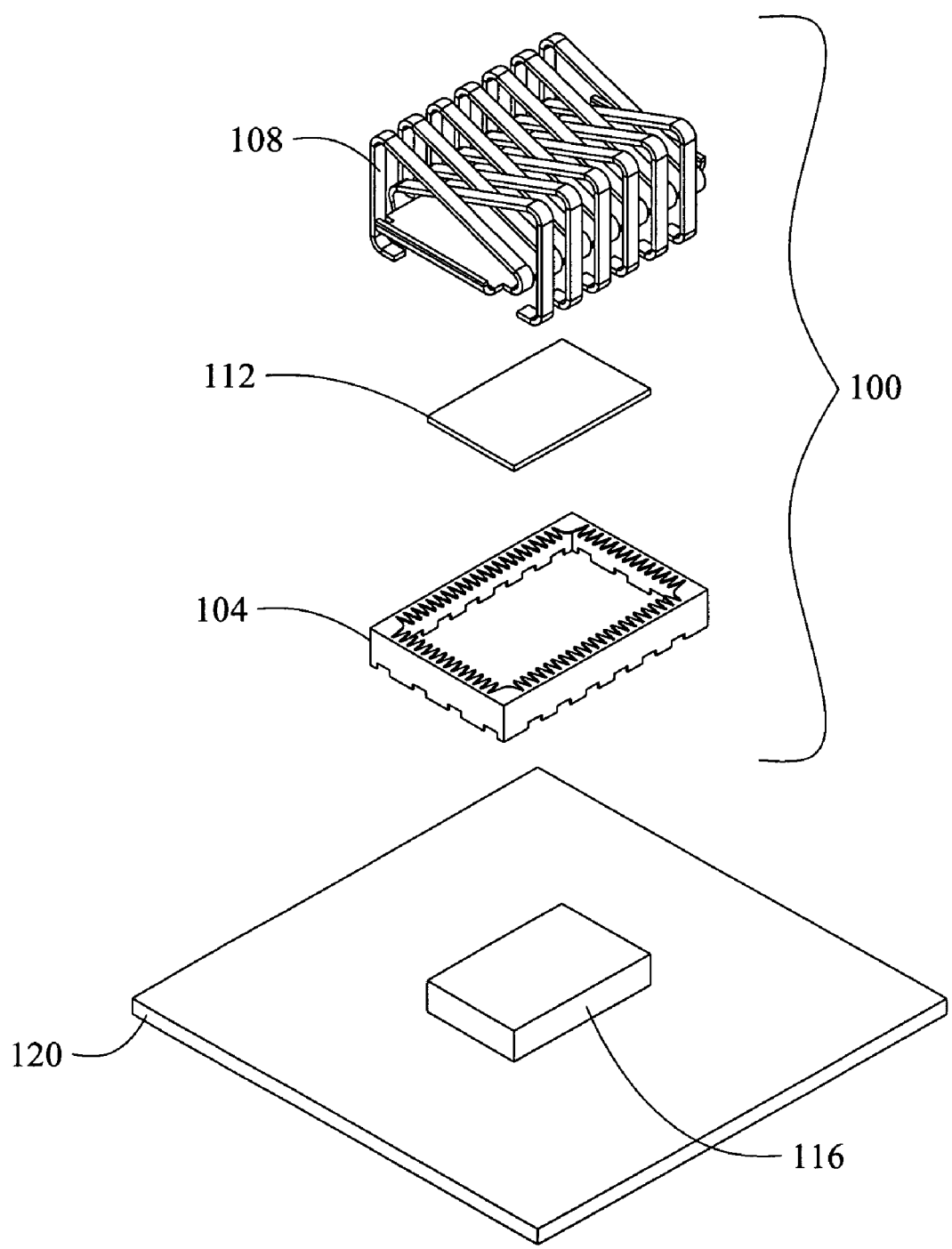
FIG. 1 is an exploded perspective view of an apparatus capable of providing board level EMI shielding and dissipating heat according to one exemplary embodiment.
Figure 2:
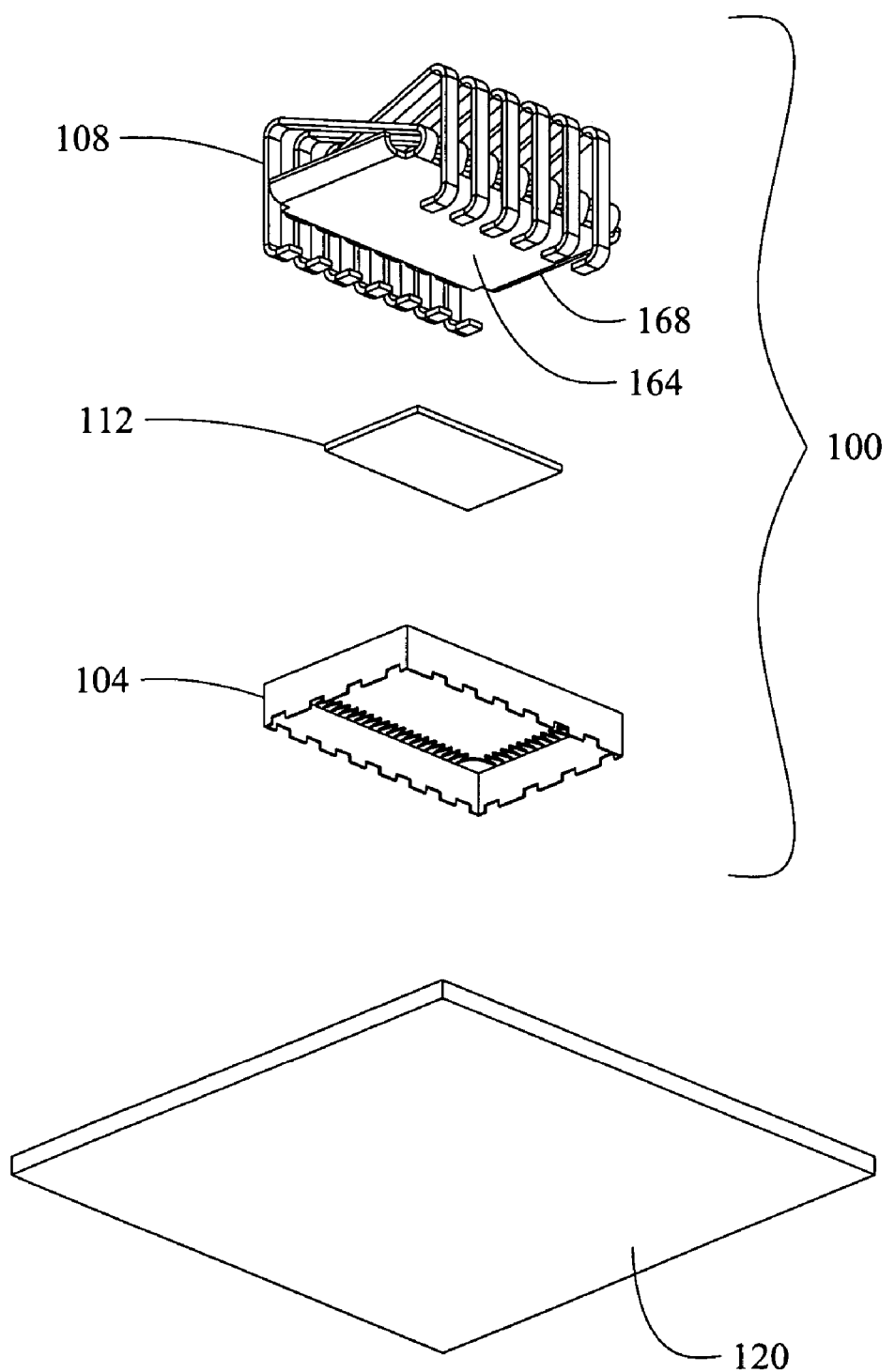
FIG. 2 is an exploded lower perspective view of the apparatus shown in FIG. 1.
Figure 3:
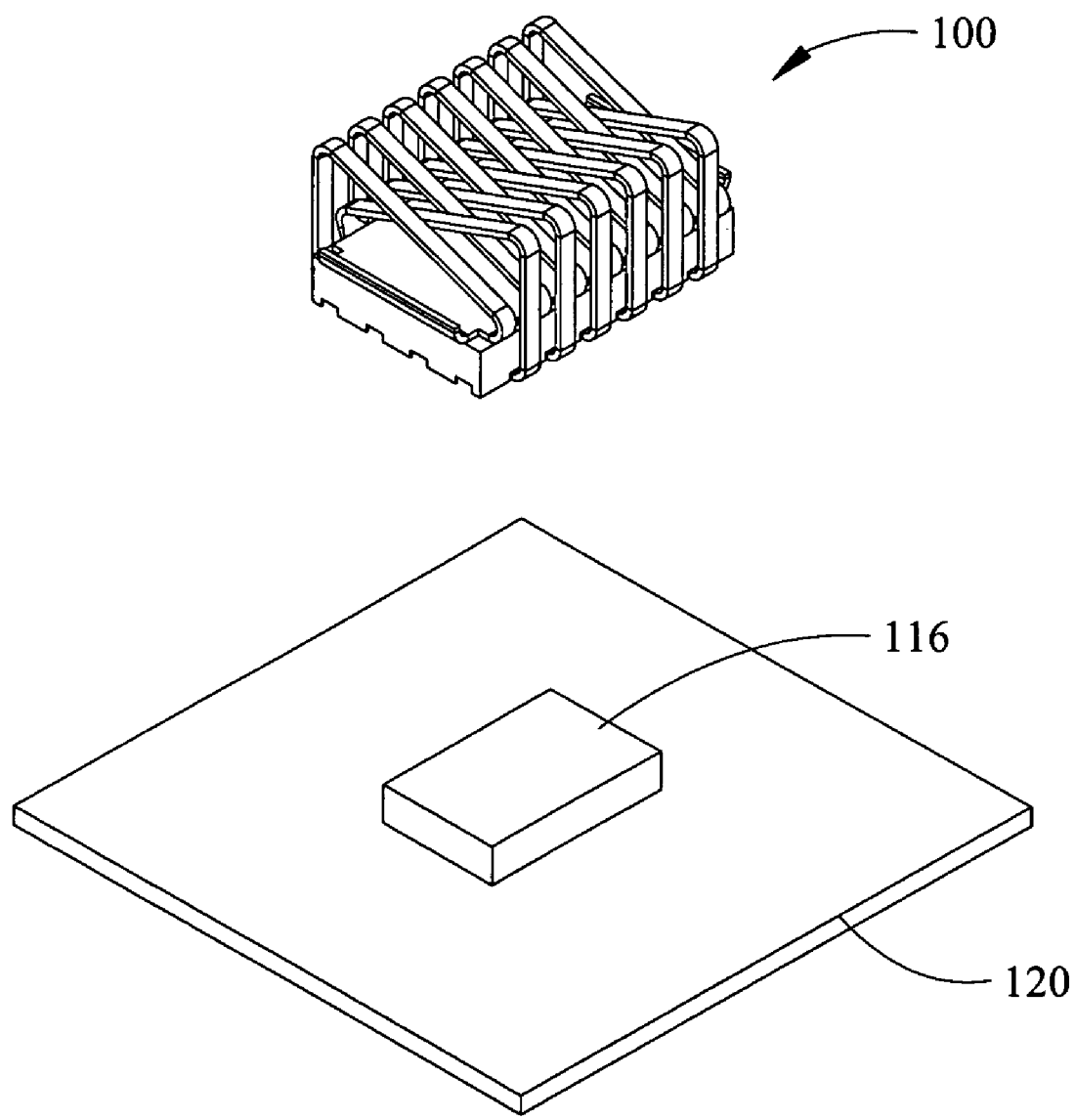
FIG. 3 is a perspective view illustrating the heat sink assembled to the fence shown in FIGS. 1 and 2.
Figure 4:
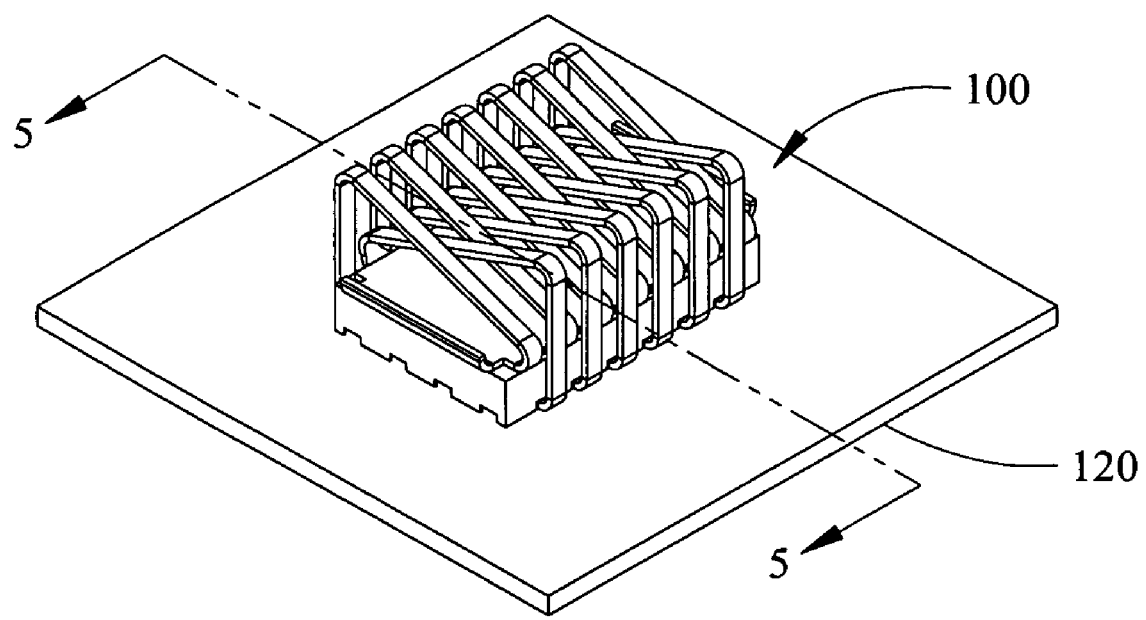
FIG. 4 is a perspective view of the apparatus shown in FIGS. 1 and 2 after the apparatus has been disposed over the board-mounted electrical component.
Figure 5:
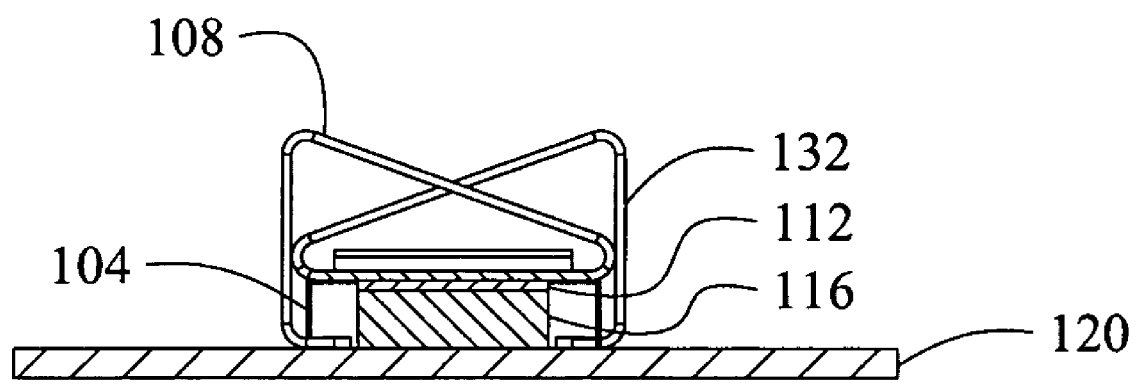
FIG. 5 is a cross-sectional view of the apparatus shown in FIG. 4 taken along the line 5-5 in FIG. 4.

FIGS. 4 and 5 illustrate the apparatus 100 disposed over an electrical component or electronics package 116, which, in turn, is surface-mounted to (or otherwise supported by) the board 120. The apparatus 100 can provide EMI shielding for the electrical component 116 and remove or dissipate heat generated by the electrical component 116. For example, the apparatus 100 can shield the electrical component 116 from other EMI emitted from other electrical or electronic components and/or prevent EMI emitted by the electrical component 116 from interfering with other components. The apparatus 100 can be used with a wide range of electrical or electronic components and packages mounted on a printed circuit board, such as surface mounted integrated circuits, microprocessors, resistors, and power transistors, by way of example.

Figure 11:
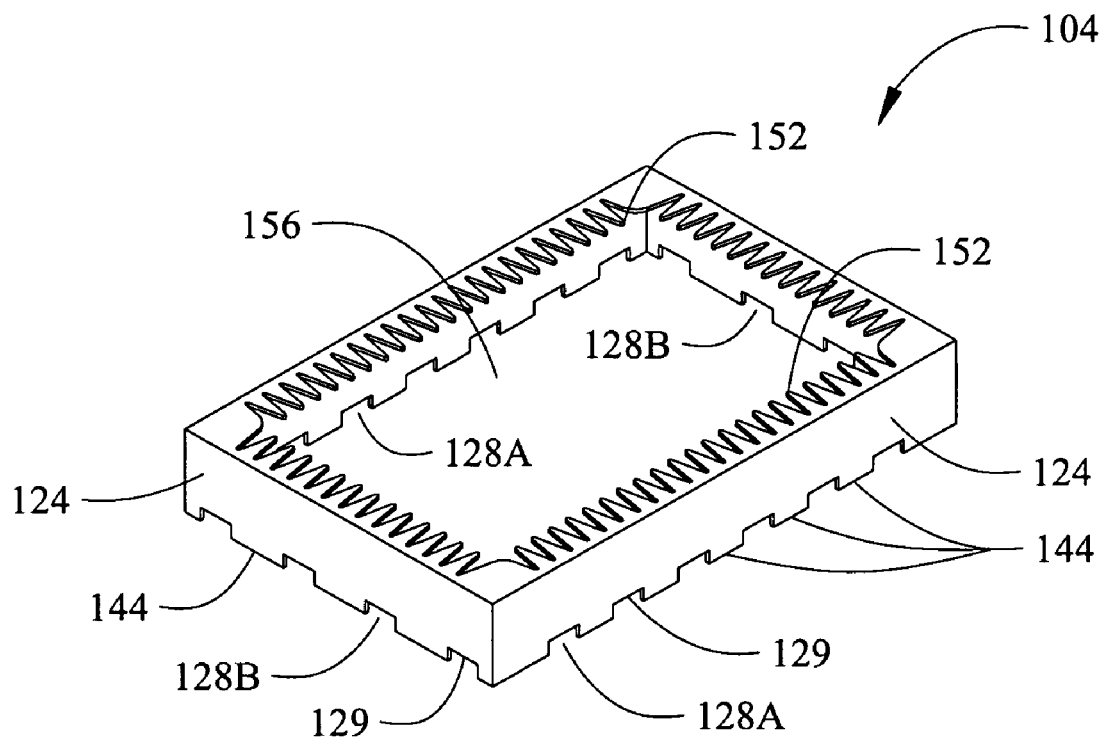
FIG. 11 is a perspective view of the fence shown in FIG. 1.

FIGS. 11 through 14 illustrate an exemplary embodiment of the frame or fence 104, which can be used in the combined EMI shielding and thermal management apparatus 100. As shown in FIG. 11, the fence 104 generally includes peripheral walls 124. While the illustrated fence 104 includes four peripheral walls 124 in a generally rectangular configuration, other embodiments can include a fence having more or less than four peripheral walls and/or peripheral walls in a non-rectangular configuration (e.g., triangular, hexagonal, circular, etc.) that conform to the component topography of the PCB or other application in which the apparatus 100 will be used.

With continued reference to FIG. 11, each fence wall 124 includes openings or notches 128 for engaging or interlocking with corresponding fingers 132 of the heat sink 108, as described in more detail herein. In this particular embodiment, fence walls 124 include generally rectangular openings or notches 128. Notches 128A are alternately opposing notches associated with opposing side walls. Notches 128B are opposing notches associated with opposing end walls. Alternative embodiments can include more or less notches (and in some cases no openings) in the fence walls 124. Plus, each fence wall 124 does not need to include the same number of notches, or each fence wall 124 may include the same number of notches. In yet other embodiments, one or more of the fence walls 124 may include other types of openings for engaging the heat sink fingers 132, such as non-rectangular shaped openings, oblong openings, slots, through-holes, etc. In some embodiments, the fence wall openings can be closed through-hole structures in fence walls 124 of varying geometric shapes that are engaged by heat-sink finger end portions that conform in shape to the geometric cross-sections of the through holes, thereby providing a locking engagement of the heat sink finger end portions to the fence wall through-holes. Such heat sink finger engaging end portions may also include added EMI shielding or gasket materials capable of providing increased EMI shielding (for example, at higher frequencies) when engaged to fence wall through-holes.

The heat sink 108 and fingers 132 are configured (e.g., shaped, sized, spaced, etc.) such that the fingers 132 can be slid over the fence walls 124 to engage the notches or openings 128 of the fence walls 124. In one exemplary embodiment, the fingers 132 are configured such that the fingers 132 may flex outwardly and/or the fence walls 124 may flex inwardly as the finger end portions 136 are slid over the fence walls 124 for engaging the openings 128.

The fence 104 also includes mounting feet 144 for contacting one or more components of the board 120 to provide for electrical contact with the board 120. As shown in FIG. 11, each fence wall 124 includes mounting feet 144, which may be integrally formed with the corresponding fence wall 124. In this particular illustrated embodiment, the walls 124 include alternately opposing mounting feet 144 with the notches 128 disposed between corresponding pairs of mounting feet 144. Depending on the particular application, the mounting feet 144 can provide mounting surfaces for mating with a ground plane or trace pads of a printed circuit board, and the feet 144 can be dimensioned to selectively mate with specific trade pad locations and dimensions.

In some embodiments, the fence 104 may be made of a material suitable for soldering the feet 144 to trace pads of a printed circuit board. Exemplary materials for the fence 104 include cold rolled steel, nickel-silver alloy, or the like. Alternative materials for the fence 104 include carbon steel, stainless steel, tin-plated cold rolled steel, etc.

While the feet 144 of the fence 104 can be soldered to a printed circuit board (PCB), the fence 104 may also be affixed or mounted to a board by any suitable manner, such as adhesives, mechanical fasteners, clips, etc. In one embodiment, the fence 104 may be attached to a printed circuit board via soldering the mounting feet 144 to grounded traces positioned on the PCB substrate and/or around the electrical circuits generating (or requiring protection from) EMI as well as around the electrical circuits that are susceptible to EMI.

With continued reference to FIG. 11, the fence 104 also includes resilient or spring fingers 152. In this particular illustrated embodiment, the fingers 152 comprise inwardly projecting triangular-shaped extensions disposed along the fence interior perimeter. The fence fingers 152 are configured for making contact with the heat sink 108. In the illustrated embodiment, the fence walls 124 define an opening or window 156 disposed along the upper portion of the fence 104 and about which the fingers 152 are generally disposed.

Figure 11A:
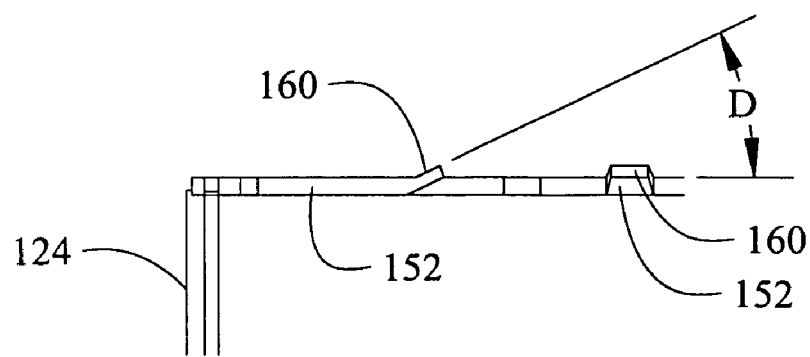
FIG. 11A is a partial view of a fence having fingers with upwardly bent or formed end portions according to exemplary embodiments.
Figure 12:
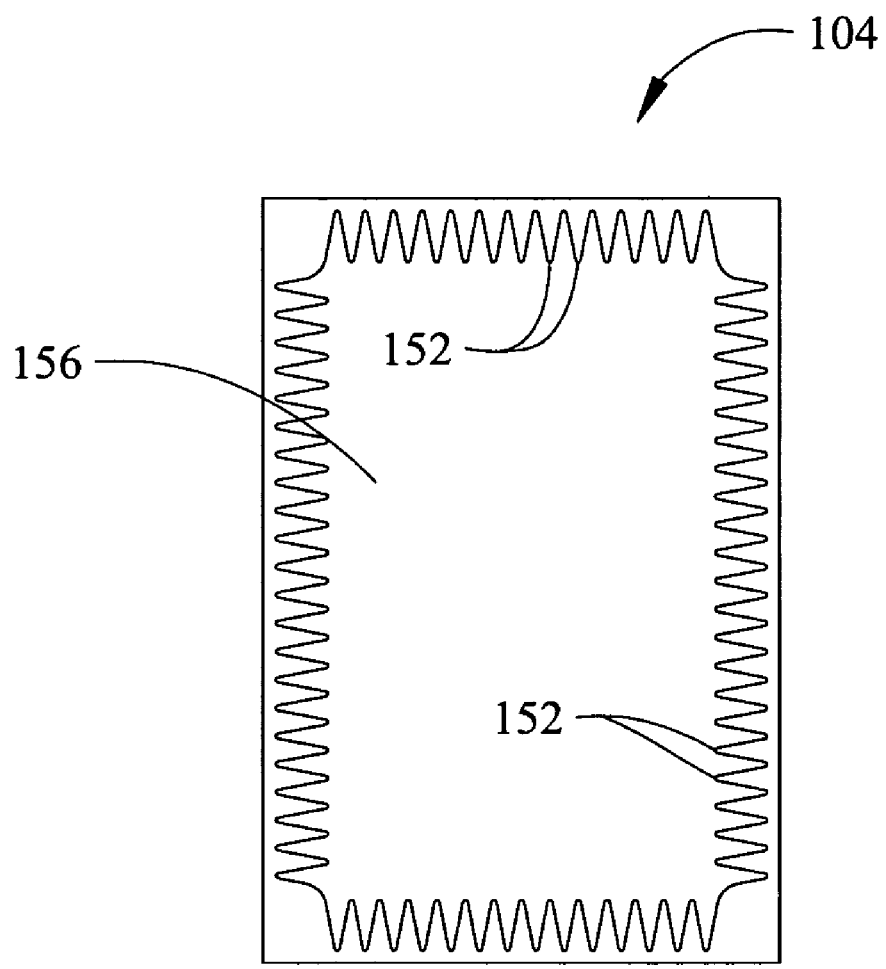
FIG. 12 is a top elevation view of the fence shown in FIG. 11.
Figure 13A:
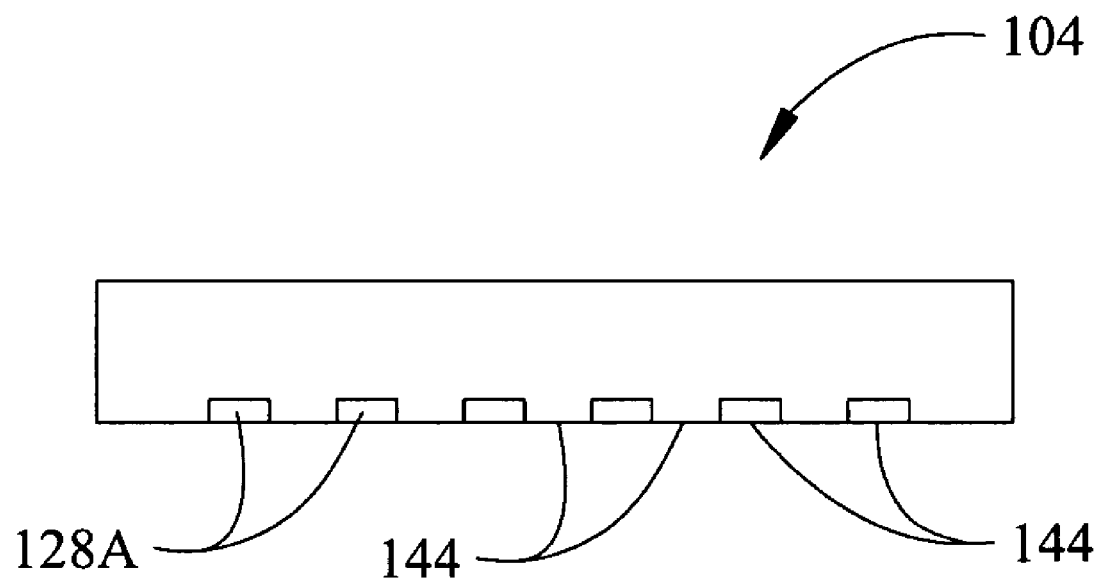
FIGS. 13A and 13B are respective right and left side elevation views of the fence shown in FIG. 11.
Figure 13B:
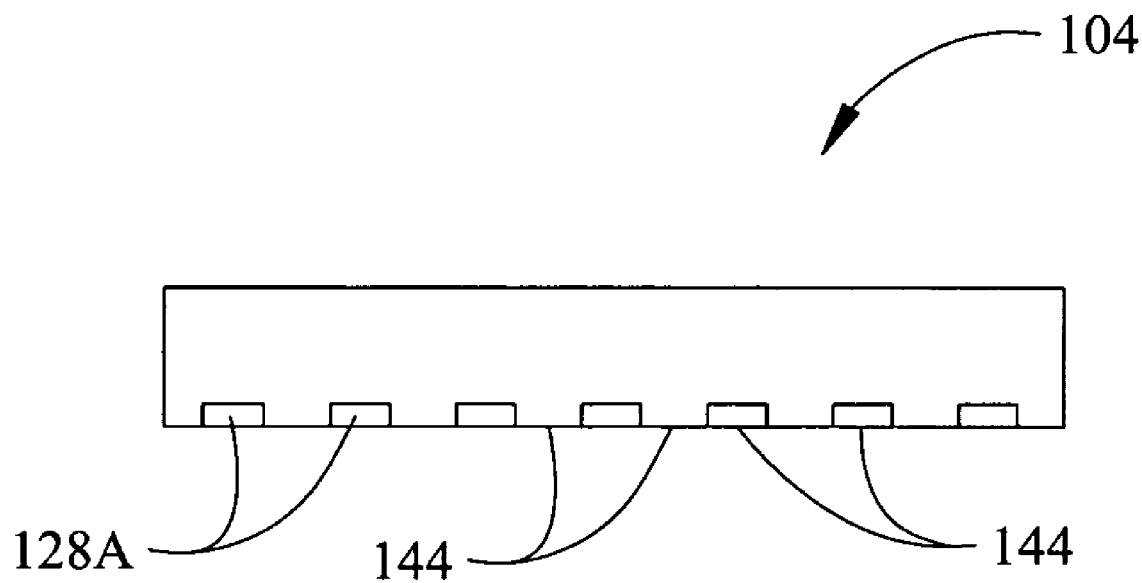
Figure 14:
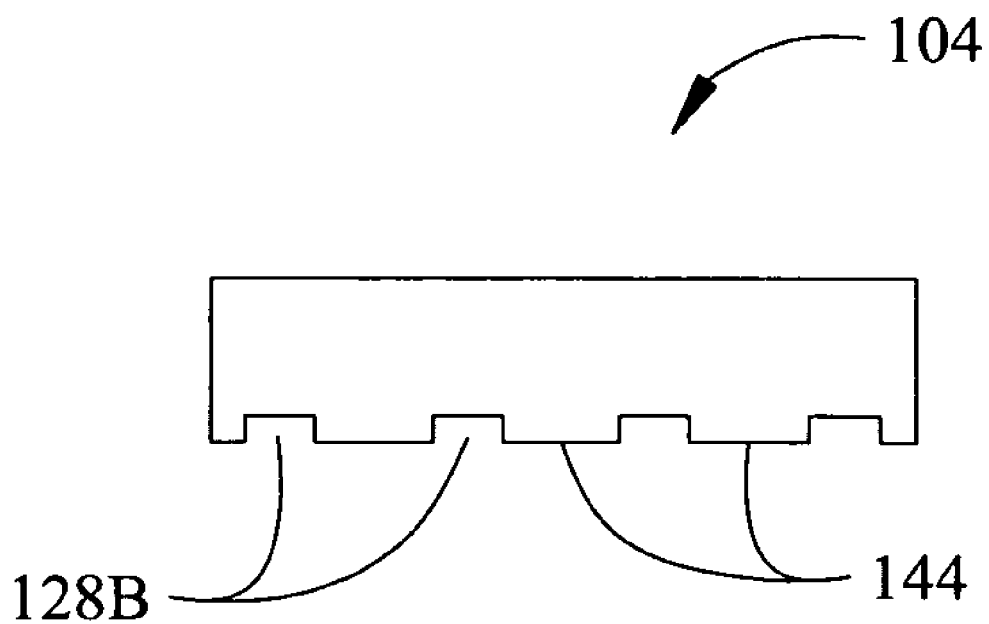
FIG. 14 is a front elevation view of the fence shown in FIG. 11.

In addition, the fence fingers 152 can include upwardly bent or formed end portions 160 (FIG. 11A) configured to help make reliable contact between the fence 104 and the underside 164 of the heat sink 108. In one particular embodiment, each fence finger 152 has an end portion 160 that is bent upwardly at an angle D of about thirty degrees.

The end portions 160 can preferably be configured such that they extend above the top edges of the fence walls 124. In other embodiments, the fence 104 may have one or more fence fingers 152 having end portions bent upwardly at angles more or less than thirty degrees. Further embodiments can include a fence 104 with one or more fence fingers 152 having end portions bent upwardly at different or varying angles. As an alternative (or in addition) to bent end portions, the fence fingers 152 may include raised portions, bumps, and/or protuberances disposed at about the free end portions of the fence fingers 152 for contacting the heat sink 108. In such embodiments, these raised portions, bumps, and/or protuberances may be integral to the fence fingers 152, or they may be discrete components that are attached (e.g., welded, adhered, etc.) to the fence fingers 152. In yet other embodiments, the fence fingers 152 do not include any such bent portions, raised portions, bumps, and/or protuberances for contacting the heat sink 108.

In various embodiments, the fence fingers 152 may also have sufficient resiliency or springiness for allowing the fence fingers 152 to move (e.g., downward in FIGS. 4 and 5) and to respond with a sufficient restorative force for making and maintaining good contact between the fence fingers 152 and the underside 164 of the heat sink lid portion or member 168. In this exemplary manner, the fence fingers 152 can help to establish good contact with the heat sink 108 when the heat sink 108 is engaged to the fence 104 via the engagement of the heat sink fingers 132 with the fence notches 128. The contact established between the fence 104 and heat sink 108 (via the fence fingers 152 and heat sink 108, and the heat sink fingers 132 within fence notches 128) can help form an electrically-conductive pathway that provides an effective amount of electrical conduction between the fence 104 and heat sink 108 for conducting electromagnetic energy absorbed by the apparatus 100 through the fence mounting feet 144 to a ground plane of the board 120. Alternative embodiments can include fences having other means for contacting a heat sink. For example, another embodiment can include additional materials (e.g., EMI gasket materials etc.) instead of, or in addition to, fence fingers 152.

In various embodiments, the contact established between the fence 104 and the heat sink 108 can provide an effective amount of electrical conduction for conducting electromagnetic energy absorbed by the apparatus 100 to a ground plane on the board 120.

In various embodiments, the fence notches 128 and the heat sink fingers 132 can also be relatively configured (e.g., sized, shaped, etc.) such that the lower surfaces 148 of the fingers 132 are generally aligned with the bottom edges of the fence walls 124. This, in turn, can inhibit electromagnetic energy from passing through or leaking out of gaps or interfaces, thus providing better shielding when the fence 104 is disposed over the electrical component 116 of the board 120.

Figure 15:
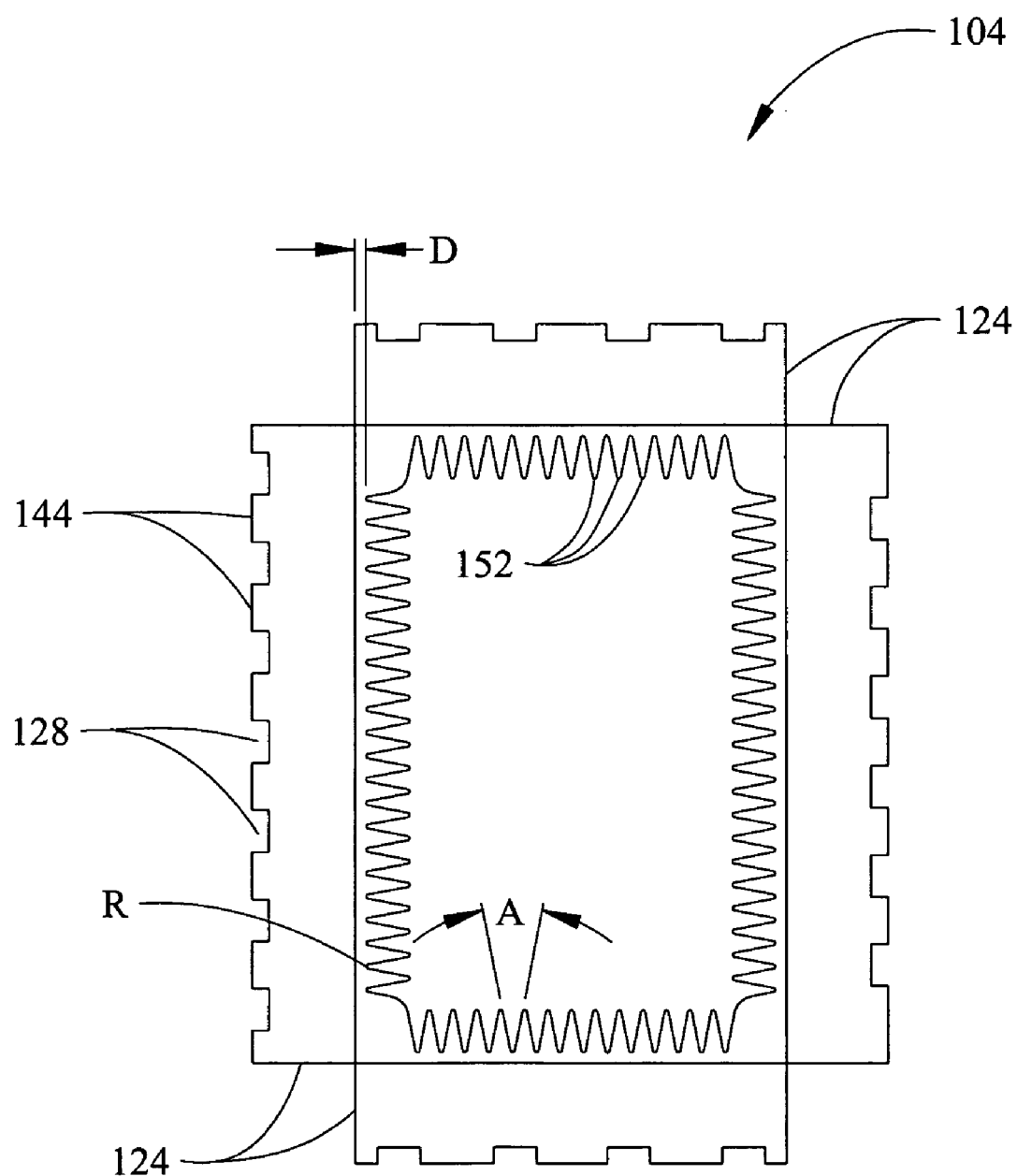
FIG. 15 is a plan view of a blank that can be used to make the fence shown in FIG. 11 before forming or bending the walls.

In various embodiments, the fence 104 can be integrally or monolithically formed as a single component. For example, FIG. 15 illustrates an exemplary blank that can be used for making the fence 104. In this particular embodiment, the fence 104 can be formed by stamping a flat profile pattern in a piece of material for the fence 104. As shown in FIG. 15, the stamped profile for the fence 104 includes peripheral walls 124 having the mounting feet 144, notches 128, and the fingers 152. After stamping the flat pattern profile for the fence 104 in the piece of material, the walls 124 may then be folded or bent generally perpendicular as shown in FIGS. 11 through 14. Even though the fence 104 can be formed integrally in this example, such is not required for all embodiments. For example, other embodiments may include the fence fingers 152 and/or protuberances thereon being discrete components that are separately engaged to the fence 104, for example, by welding, among other suitable methods. Alternative configurations (e.g., shapes, sizes, etc.), materials, and manufacturing methods can be used for making the fence 104. For example, other embodiments can include fences manufactured by drawing. Depending on the particular application, a drawn fence with closed corners may be preferable to other types of fences having non-closed or open corners.

A wide range of materials can be used for the fence 104, such as cold rolled steel, stainless steel, nickel-silver alloy, tin-plated cold rolled steel, tin plated copper alloy, carbon steel, brass, copper, aluminum, copper beryllium alloy, phosphor bronze, steel, combinations thereof, other suitable electrically conductive and/or non-magnetic materials.

In one exemplary embodiment, a fence 104 is formed from a sheet of non-heat treated material (e.g., tin-plated copper alloy, etc.) having a thickness between about 0.008 inch to about 0.010 inch, a length of about 1.949 inches, and a width of about 1.449 inches. Continuing with this particular example, the fence 104 can be formed such that the notches 128 along the shorter fence walls 128 have a height of about 0.020 inch, while the notches 128 along the longer fence walls 128 have a height of about 0.039 inch. The resulting fence 104 can have a length of about 1.50 inches, a width of about 1.00 inch, and a height of about 0.236 inch. Regarding the fence fingers 152, the angle A formed between adjacent fence fingers 152 can be about twenty degrees, the distance D can be about 0.025 inch, and the radius of curvature R between adjacent fingers can be about 0.010 inch. In some embodiments, the fence fingers 152 can have protuberances at the finger free-end portions, where the protuberances have a height of about 0.006 inch relative to the top surfaces of the fingers 152. The dimensions provided in this paragraph (as are all dimensions set forth herein) are for purposes of illustration only, as the dimensions and materials used for a particular fence can be varied and modified, based on the size of the component(s) to be shielded, space considerations within the overall apparatus, and other factors.

Figure 6:
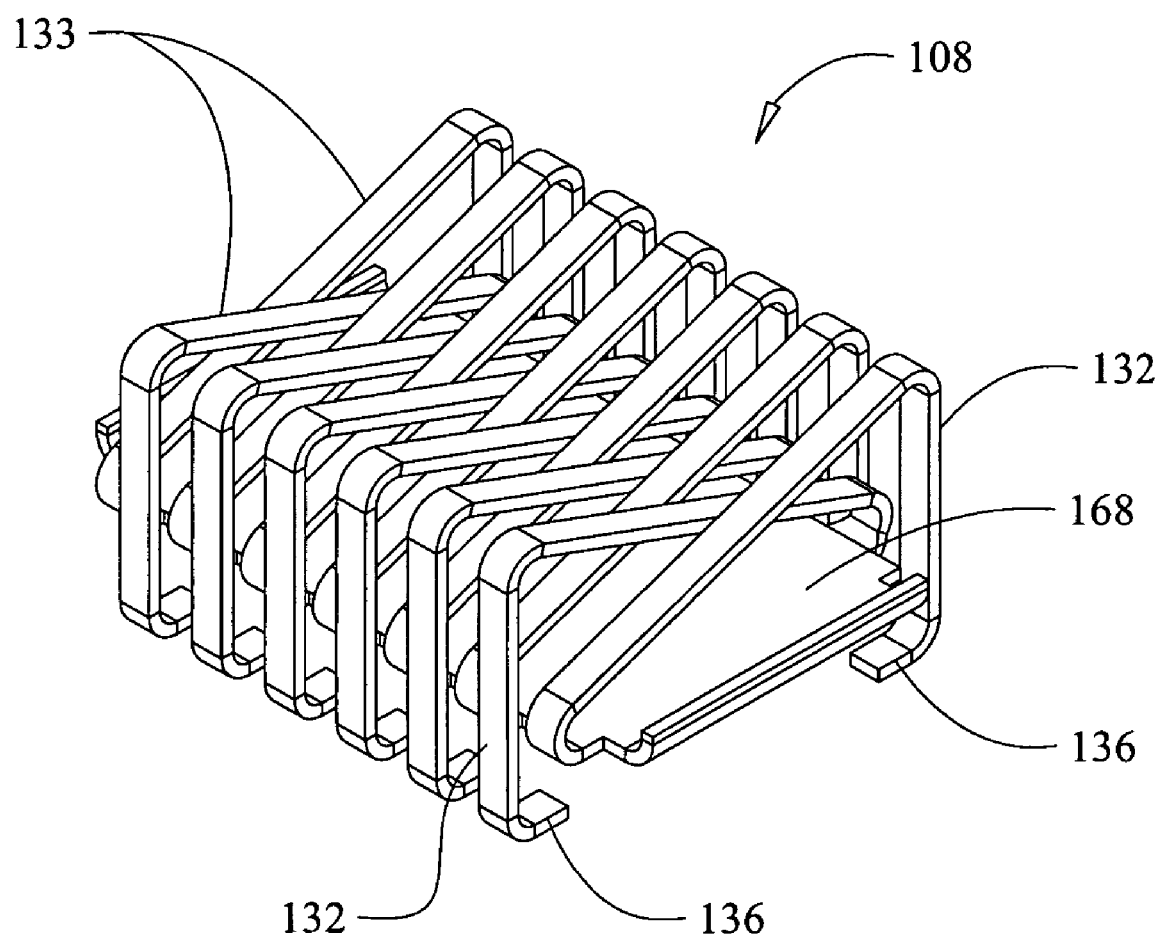
FIG. 6 is a perspective of the heat sink shown in FIG. 1.

FIGS. 6 through 9 illustrate an exemplary heat sink 108 that can be used in the combined EMI shielding and thermal management apparatus 100. As shown in FIG. 6, the heat sink 108 generally includes the lid portion or member 168 and fingers 132. The end portions 136 of the fingers 132 are configured for engaging the fence's notches 128 (or other suitable openings in a fence or board).

In various embodiments, the engagement portions 136 can include inward extensions having generally curved, bent, U-shaped, or L-shaped transverse profiles. In some embodiments, the heat sink fingers 132 may be biased inwardly toward the corresponding fence wall 124. The flexible tension grip of the heat sink fingers 132 onto the fence walls 124 can help provide relatively good thermal and electrically-conductive contact therebetween. While the illustrated embodiment shows the end portions 136 with generally curved or bent L-shaped transverse profiles, other cross-sectional shapes (e.g., U-shaped, etc.) are also possible depending, for example, on the particular application in which the apparatus 100 will be used.

The upper portions 133 of the fingers 132 can operate as cooling surfaces or fins for transferring heat from the heat sink 108 to the surrounding environment. In addition, the heat sink 108 can also be formed from a material having sufficient resiliency or springiness to permit outward movement of the fingers 132 for allowing the fingers 132 to slide generally over the fence walls 124, and then to respond with a sufficient restorative force (after the finger end portions 136 pass the upper edges 129 of the notches 128) for securely engaging the notches 128 and for making/maintaining good contact between the fingers 132 and the fence walls 124. In some embodiments, the resilient engagement of the finger end portions 136 with the notches 128 can flex, deflect and/or deform the fingers 132 such that a clamping force is applied generally between the heat sink fingers 132 and the fence 104.

The resiliency or springiness of the heat sink fingers 132 and their engagement within the fence notches 128 can apply a clamping force for biasing the generally horizontal heat sink lid portion or member 168 downward relative to the thermal interface 112 (or, in some embodiments, directly onto the electrical component 116 if no thermal interface is used). This biasing pressure can help hold the heat sink member 168 down firmly against the thermal interface 112 and/or compress the thermal interface 112 against the electrical component 116. This, in turn, can help retain good thermal contact between the heat sink 108, thermal interface 112, and electrical component 116. In this exemplary manner, the engagement of the fingers 132 with the notches 128 can help create and maintain sufficient contact for providing the apparatus with low thermal impedance and good heat dissipation capacity.

In some embodiments, the biasing force applied by the heat sink fingers 132 (when engaged within notches 128 of the fence wall 124) can also help maintain good thermal and/or electrical contact between the heat sink underside 164 and the fence fingers 152. For example, the biasing force can help hold the heat sink 108 down firmly against the fence 104. This, in turn, can help reduce any gaps between the fence 104 and the heat sink 108, thereby inhibiting electromagnetic energy from passing through or leaking out through the interface between the heat sink 108 and the fence 104, and/or through the window 156 of the fence 104.

In addition, the inner lower surfaces 148 of the finger engagement members 136 can also be configured (e.g., curved, etc.) to operate as camming surfaces. For example, as the heat sink 108 is being relatively moved onto the fence 104, contact between the curved inner lower surfaces 148 of the heat sink fingers 132 and the fence 104 can urge the heat sink fingers 132 generally outwards. This, in turn, can allow the finger end portions 136 to slide generally over the fence walls 124. After the finger end portions 136 clear the top edges 129 of the notches 128, the heat sink fingers 132 and their end portions 136 may then spring generally inwardly to thereby engage or interlock with the notches 128.

Figure 10:
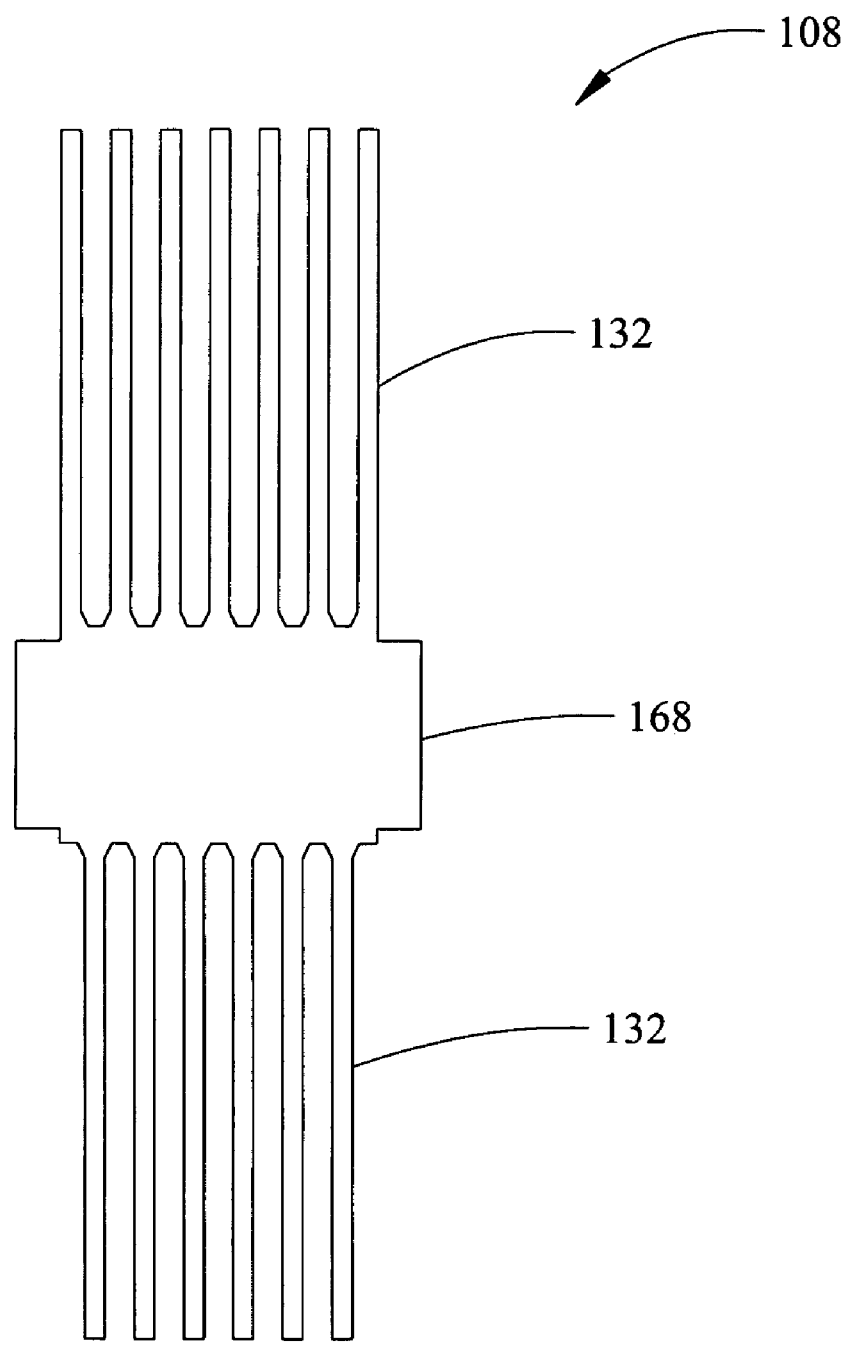
FIG. 10 is a plan view of a blank that can be used to make the heat sink fingers shown in FIG. 6 before forming or bending the fingers.

In various embodiments, the heat sink 108 can be integrally or monolithically formed as a single component. For example, FIG. 10 illustrates an exemplary blank that can be used for making the heat sink 108. In this particular embodiment, the heat sink 108 can be formed by stamping a profile flat pattern for the heat sink 108 in a piece of material. As shown in FIG. 10, the stamped profile for the heat sink 108 includes the lid portion or member 168 and fingers 132 extending outwardly therefrom. After stamping the flat pattern profile for the heat sink 108 in the piece of material, the fingers 132 may then be folded or bent to the configuration shown in FIGS. 6 through 9. Even though the heat sink 108 can be formed integrally in this example, such is not required for all embodiments. For example, other embodiments may include the heat sink fingers 132 being discrete components that are separately engaged to the generally flat heat sink member 168, for example, by welding, among other suitable methods. Alternative configurations (e.g., shapes, sizes, etc.) and manufacturing methods can be used for making the heat sink 108.

The heat sink 108 can be formed from a wide variety of materials, which are preferably good thermally conducting and EMI shielding materials. In various embodiments, the heat sink 108 is also formed of a resilient material. Exemplary materials from which the heat sink 108 can be formed include beryllium copper alloys, aluminum, brass, phosphor bronze, etc. In some embodiments, the heat sink 108 may comprise bare or uncoated metal. In some other embodiments, the heat sink 108 may comprise a metal coated with a suitable electrically-conductive plating to provide galvanic compatibility with the fence 104. In some preferred embodiments, the heat sink 108 (or at least its heat sink fingers 132) is made of a springy material such that the fingers can snap into the openings of the fence walls, thereby providing sufficient force between the fence and the heat sink for enhancing thermal contact between the heat sink 108 and the thermal interface 112.

In one exemplary embodiment, the heat sink 108 is formed from a sheet of brass (which may be tin-plated) having a thickness of about 0.032 inch. Continuing with this particular example, the heat sink 108 can be formed such that the angle B formed between the each heat sink finger's generally vertical portion 174 and angled portion 176 is about seventy degrees. The angle C formed between each heat sink finger's slanted portion 176 and the upper surface 178 of the heat sink member 168 can be about twenty degrees. Each heat sink finger 132 can also have radii of curvature R2 of about 0.050 inch, and a width W of about 0.085 inch. The gap or spaced distance D2 as shown in FIG. 8 between adjacent fingers 132 can be about 0.020 inch. The gap or spaced distance D3 between the finger engagement members 136 and the lower surface 164 of the heat sink member 168 (FIG. 7) can be about 0.021 inch. The dimensions provided in this paragraph (as are all dimensions set forth herein) are for purposes of illustration only, as the dimensions and materials used for a particular heat sink can be varied and modified, based on the size of the component to be shielded, space considerations within the overall apparatus, and other factors. For example, other embodiments can include heat sink fingers with different radii of curvature such that each curved portion of a heat sink finger does not have the same radius of curvature.

Figure 7:
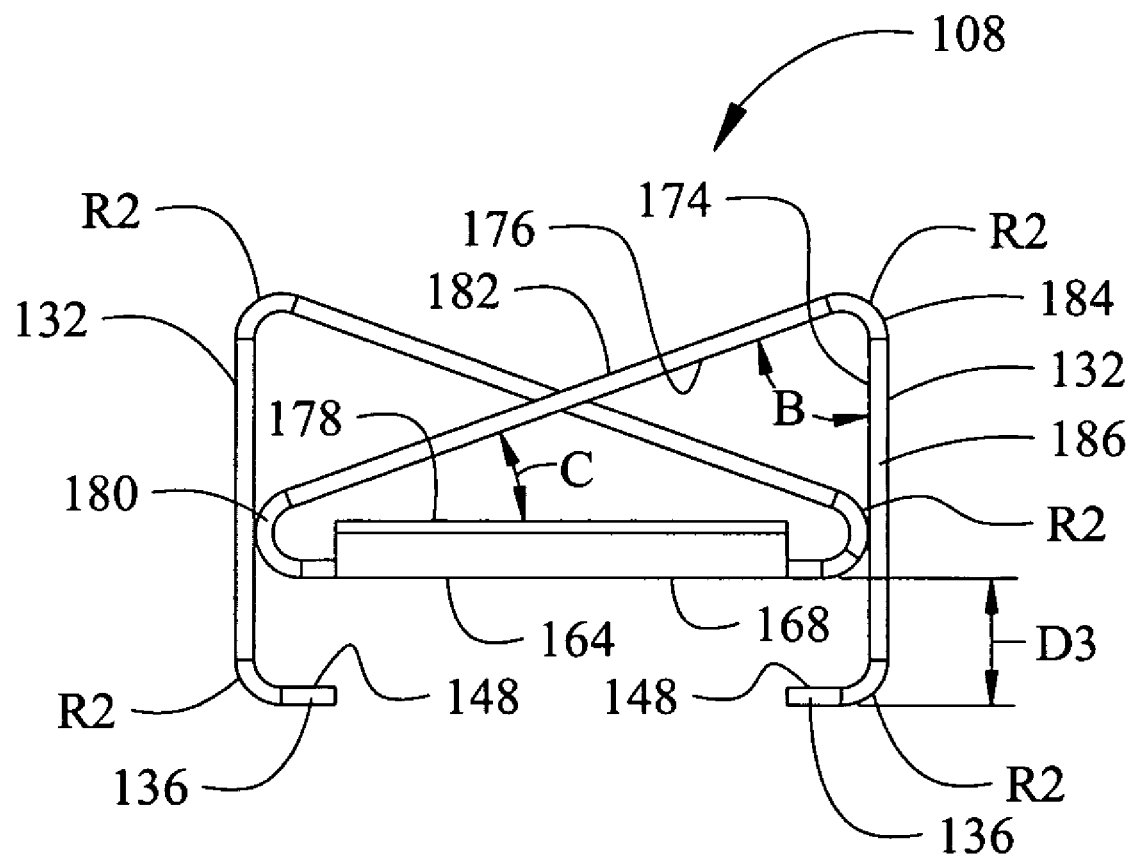
FIG. 7 is a front elevation view of the heat sink shown in FIG. 6.
Figure 8:
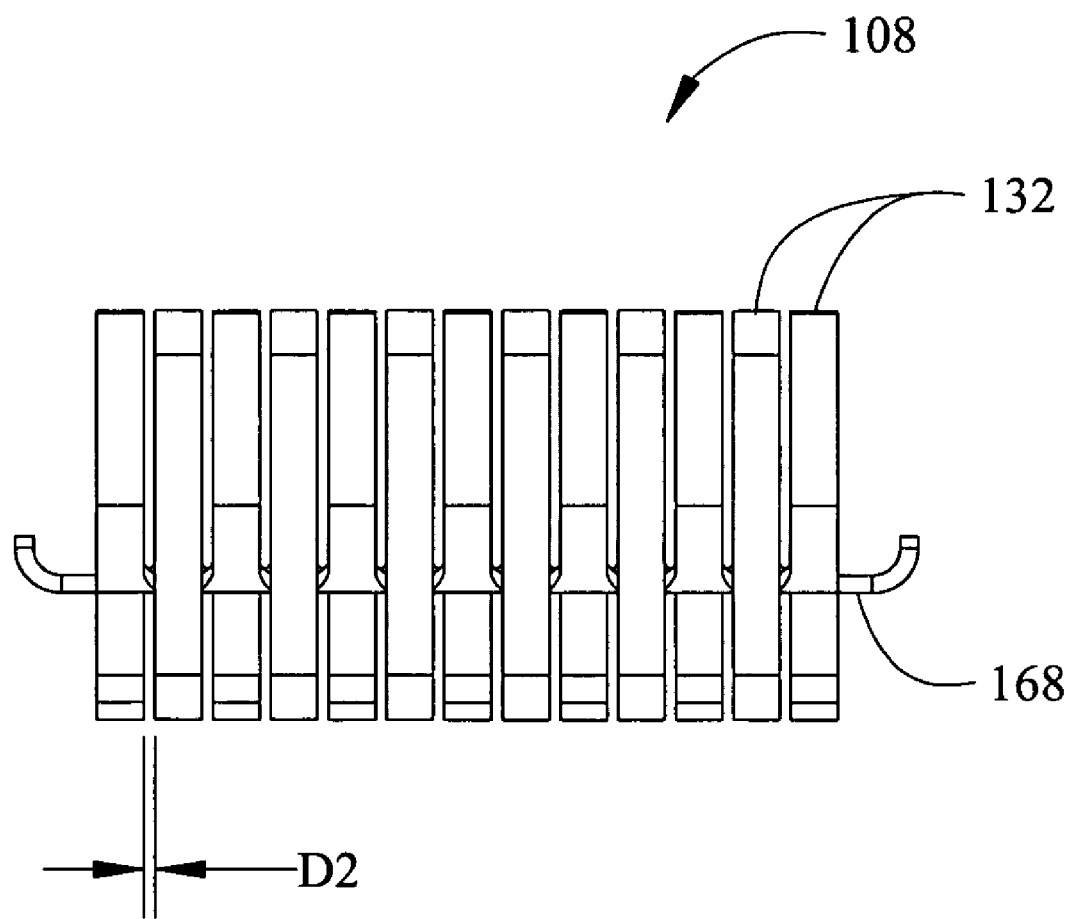
FIG. 8 is a side elevation view of the heat sink shown in FIG. 6.
Figure 9:
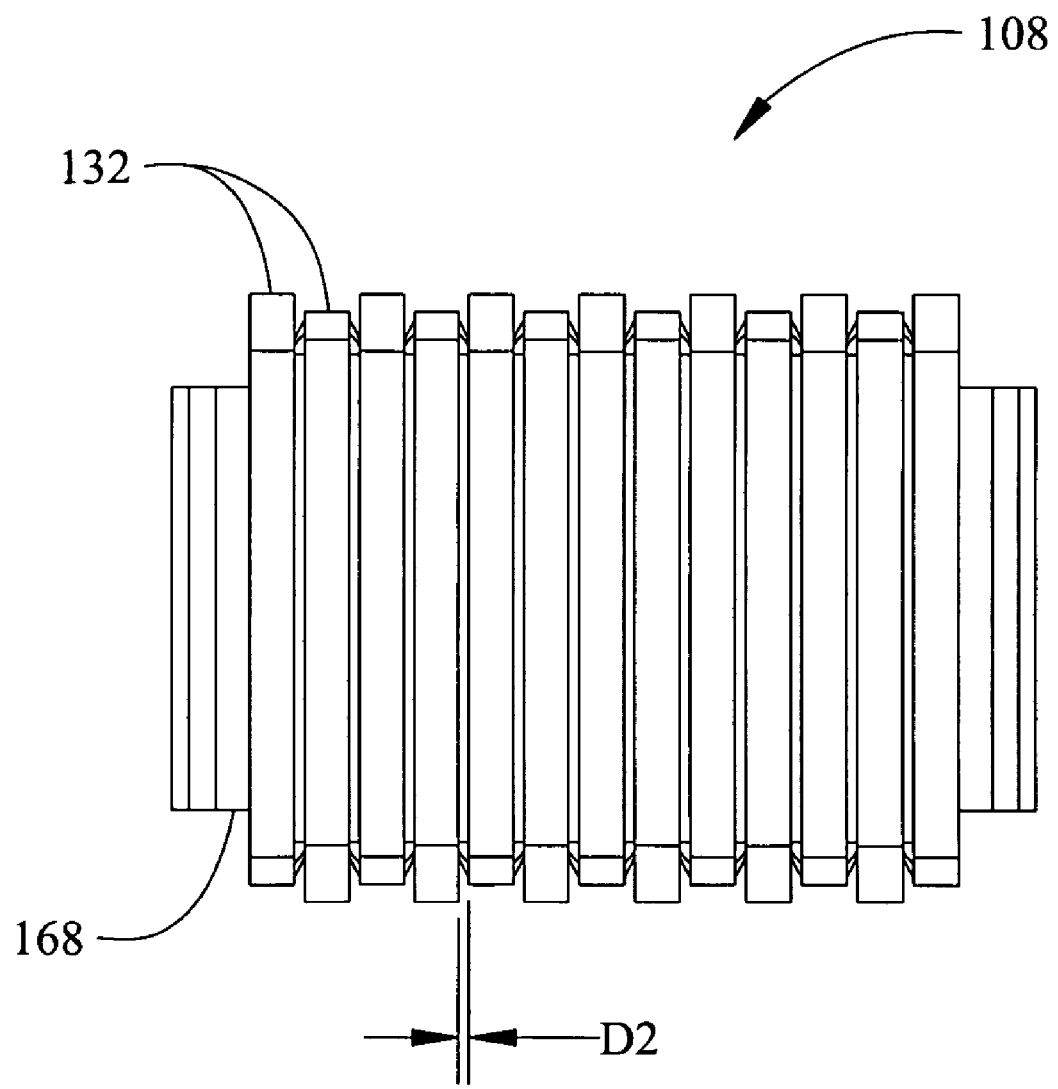
FIG. 9 is a top plan view of the heat sink shown in FIG. 6.

As shown in FIG. 7, the illustrated embodiment of the heat sink 108 includes the generally horizontal member or lid portion 168. Each heat sink finger 132 includes a first curved portion 180 extending from the generally horizontal member 168, a second slanted portion 182 extending from the first curved portion 180 and disposed above the generally horizontal member 168, a third curved portion 184 extending from the second slanted portion 182, a fourth generally vertical portion 186 extending from the third curved portion 184, and the engagement portion 136 extending from the fourth generally vertical portion 184. Accordingly, in this particular embodiment, each finger 132 includes a generally triangular profile. Alternative embodiments can include more or less heat sink fingers 132 and/or one or more heat sink fingers 132 having different configurations (e.g., shaped, sized, etc.) than what is shown in the figures.

For example, FIG. 16 illustrates another embodiment of a combined EMI shielding and thermal management apparatus 200. As shown, the heat sink fingers 232 of the heat sink 208 have a generally quadrilateral shape within a generally triangular profile. But in this particular embodiment, the profile of the heat sink fingers 232 includes a fourth side 283 formed by truncating sides 282 and 284, thereby producing heat sink fingers having a lower overall height relative to the upper surface of the board Also shown in FIG. 16, the apparatus 200 also includes a fence 204 and a thermal interface 212 disposed between the heat sink 208 and electronic component 216.

Various embodiments can thus provide a relatively simple-to-construct fence and heat sink, where the heat sink can be snapped onto the fence or the board. The heat sink can include a contact surface area to draw heat from an electrical component and cooling fins for transferring such heat to the surrounding environment.

In the illustrated embodiment of FIGS. 1 through 5, the apparatus 100 includes the thermal interface 112 disposed between the heat sink 108 and electrical component 116. The thermal interface 112 can comprise one or more separate layers disposed on the electrical component 116 and/or one or more separate layers disposed on the lower surface 164 of the heat sink member 168. In one particular embodiment, the thermal interface 112 preferably has a thickness no larger than the gap between top of fence 104 and the top of the electrical component 116.

A wide variety of materials can be used for the thermal interface 112. By way of example, various embodiments can include a thermal interface formed from ceramic particles, ferrite EMI/RFI absorbing particles, metal or fiberglass meshes in a base of rubber, gel, grease or wax, etc. Alternative embodiments, however, can provide an apparatus that does not include a separate thermal interface 112. In such embodiments, the heat sink can make direct physical contact with and abut the electrical component or package over which the apparatus is disposed.

In some embodiments, EMI gasket material or other suitable gap fillers may be disposed generally between the heat sink fingers and the fence, such as for shielding applications with frequencies above five hundred megahertz. Alternatively, other embodiments do not include such EMI gasket material or gap fillers between the heat sink fingers and the fence.

With reference to FIGS. 4 and 5, a description will now be provided of an exemplary use of the apparatus 100. In this particular example, the apparatus 100 can be shipped or delivered with the thermal interface 112 disposed on the heat sink 108. The fence 104 can then be mounted to the board 120 such that the fence 104 is disposed generally around the electrical component 116. By way of example, the mounting feet 144 of the fence 104 can be soldered to traces of the board 120.

Next, the heat sink 108 (with the thermal interface 112 thereon) can be snapped into the working position such that heat sink fingers 132 are engaged with the fence's notches 128. For example, the heat sink 108 can be relatively moved towards the fence 104 such that the lower surfaces 148 of the heat sink fingers 132 contact the fence 104. At which point, continued relative movement of the heat sink 108 onto the fence 104 allows the lower surfaces 148 to operate as camming surfaces for urging the fingers 132 to move generally outward. With the outward movement of the heat sink finger end portions 136, the heat sink finger end portions 136 can slide generally over the fence walls 124. After the heat sink finger end portions 136 clear the upper edges 129 of the fence notches 128, the heat sink finger end portions 136 may spring generally inwardly thereby engaging or interlocking with the fence notches 128.

With the engagement of the heat sink finger end portions 136 with the notches 128, the resiliency or springiness of the heat sink fingers 132 can apply a biasing pressure forcing the heat sink member 108 downward onto the thermal interface 112 (or, in some embodiments, directly onto the electronic component if no thermal interface is used). This biasing pressure can help hold the heat sink member 168 down firmly against the thermal interface 112 and/or compress the thermal interface 112 against the electrical component 116. This, in turn, can help retain good thermal contact between the heat sink 108, thermal interface 112, and electrical component 116. In this exemplary manner, the engagement of the fingers 132 with the notches 128 can help create and maintain sufficient contact for providing the apparatus with low thermal impedance and good heat dissipation capacity.

In addition, as the heat sink 108 is being engaged or assembled to the fence 104, the heat sink's underside 164 can make contact with the fence fingers 152. At which point, continued relative movement of the heat sink 108 onto the fence 104 can urge and cause downward movement of the fence fingers 152. In various embodiments, the fence fingers 152 have sufficient resiliency or springiness to permit the downward movement of the fence fingers 152 and also cause the fence fingers 152 to respond with a sufficient restorative force for making and maintaining good contact between the fence fingers 152 and the heat sink underside 164. In this exemplary manner, the fence fingers 152 can help to establish good contact with the heat sink 108.

In some embodiments, the biasing force applied by the heat sink fingers 132 (when engaged within notches 128 of the fence wall 124) can also help maintain good thermal and/or electrical contact between the heat sink underside 164 and the fence fingers 152. For example, the biasing force applied by the heat sink fingers 132 can help hold the heat sink underside 164 down firmly against the fence 104. This, in turn, can help reduce any gaps between the fence 104 and the heat sink 108, thereby inhibiting electromagnetic energy from passing through or leaking out through the interface between the heat sink 108 and the fence 104, and/or through the window 156 of the fence 104.

Accordingly, contact established between the fence 104 and heat sink 108 (via the fence fingers 152 and heat sink underside 164, and the heat sink fingers 132 within fence notches 128) can help form an electrically-conductive pathway for conducting electromagnetic energy absorbed by the apparatus 100 through the fence mounting feet 144 to a ground plane via the board 120.

FIG. 17 illustrates another embodiment of a combined EMI shielding and thermal management apparatus 300 embodying one or more aspects of the present disclosure. In this particular example, the heat sink fingers 332 of the heat sink 308 are positioned through openings 327 in the board 320 such that the end portions 336 of the heat sink fingers 332 are engaged with a lower surface 321 of the board 320. Alternatively, the apparatus 300 may also be used with boards that do not have any such openings 327. In such alternative embodiments, the fingers can be configured to be positioned generally around and under the board (instead of through openings) to engage the board's underside. Or, for example, the end portions of the fingers may be engagingly received within openings or notches defined by the fence.

Advantageously, various embodiments can thus allow cost savings to a customer/manufacturer. This is because a customer/manufacturer can purchase a combined EMI shielding and thermal management apparatus (e.g., as a kit, etc.) instead of purchasing separate apparatus to respectively provide EMI shielding and to provide thermal management.

Certain terminology is used herein for purposes of reference only, and thus is not intended to be limiting. For example, terms such as "upper", "lower", "above", "below", "front", "back", "rear", "bottom", and "side" can refer to directions in the drawings to which reference is made and/or can describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the methods "steps", "processes", and "operations" thereof described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An apparatus for providing board level EMI shielding and dissipating heat from one or more electrical components of a board, the apparatus comprising:
   a fence including a plurality of walls defining at least one opening along an upper portion of the fence, the plurality of walls configured to be disposed generally about the one or more electrical components;
   a heat sink having resilient fingers connected to a lid portion, the resilient fingers configured to engage openings of at least one of the fence and the board, the lid portion configured to substantially entirely cover the at least one opening of the fence for cooperatively shielding the one or more electrical components within the interior defined by the lid portion and the fence's walls; and
   a thermal interface configured such that engagement of the resilient fingers with the openings compresses the thermal interface between the lid portion and the one or more electrical components, thereby forming a thermally-conducting heat path from the one or more electrical components to the heat sink;
   wherein at least one of the fingers includes a first portion connected to a first side of the lid portion, a second portion disposed above the lid portion, and a third portion disposed along the second side of the lid portion that is generally opposite the first side.

2. The apparatus of claim 1, wherein the lid portion is sized to cover the substantial entirety of the fence's upper portion.

3. The apparatus of claim 1, wherein the resilient fingers include cam surfaces configured such that assembling the heat sink to the fence positions the cam surfaces into contact with the fence causing the resilient fingers to move generally outward, thereby allowing the resilient fingers to be moved across the fence's walls for engaging the openings.

4. The apparatus of claim 1, wherein the resilient fingers include engagement portions having generally U-shaped or L-shaped profiles for engaging the openings.

5. The apparatus of claim 1, wherein the fence's walls include mounting feet for electrically contacting one or more traces of a board, and wherein the openings comprises notches defined by the fence walls between corresponding pairs of the mounting feet.

6. The apparatus of claim 1, wherein the fence is formed from a single blank of material.

7. The apparatus of claim 1, wherein the heat sink is formed from a single blank of material.

8. An electronic device including the apparatus of claim 1.

9. An apparatus for providing board level EMI shielding and dissipating heat from one or more electrical components of a board, the apparatus comprising:
   a fence including a plurality of walls defining at least one opening along an upper portion of the fence, the plurality of walls configured to be disposed generally about the one or more electrical components;
   a heat sink having resilient fingers connected to a lid portion, the resilient fingers configured to engage openings of at least one of the fence and the board, the lid portion configured to substantially entirely cover the at least one opening of the fence for cooperatively shielding the one or more electrical components within the interior defined by the lid portion and the fence's walls; and
   a thermal interface configured such that engagement of the resilient fingers with the openings compresses the thermal interface between the lid portion and the one or more electrical components, thereby forming a thermally-conducting heat path from the one or more electrical components to the heat sink;
   wherein at least one of the resilient fingers connects to a first side of the lid portion, extends at least partially around the lid portion, and terminates along a second side of the lid portion generally opposite the first side.

10. An apparatus for providing board level EMI shielding and dissipating heat from one or more electrical components of a board, the apparatus comprising:
    a fence including a plurality of walls defining at least one opening along an upper portion of the fence, the plurality of walls configured to be disposed generally about the one or more electrical components;
    a heat sink having resilient fingers connected to a lid portion, the resilient fingers configured to engage openings of at least one of the fence and the board, the lid portion configured to substantially entirely cover the at least one opening of the fence for cooperatively shielding the one or more electrical components within the interior defined by the lid portion and the fence's walls; and
    a thermal interface configured such that engagement of the resilient fingers with the openings compresses the thermal interface between the lid portion and the one or more electrical components, thereby forming a thermally-conducting heat path from the one or more electrical components to the heat sink;
    wherein at least one of the resilient fingers includes a first curved portion extending from the lid portion, a second slanted portion extending from the first curved portion and disposed above the lid portion, a third curved portion extending from the second slanted portion, a fourth generally vertical portion extending from the third curved portion, and an engagement portion extending from the fourth generally vertical portion for engaging a corresponding opening of at least one of the fence and the board.

11. An apparatus for providing board level EMI shielding and dissipating heat from one or more electrical components of a board, the apparatus comprising:
   a fence including a plurality of walls defining at least one opening along an upper portion of the fence, the plurality of walls configured to be disposed generally about the one or more electrical components;
   a heat sink having resilient fingers connected to a lid portion, the resilient fingers configured to engage openings of at least one of the fence and the board, the lid portion configured to substantially entirely cover the at least one opening of the fence for cooperatively shielding the one or more electrical components within the interior defined by the lid portion and the fence's walls; and
   a thermal interface configured such that engagement of the resilient fingers with the openings compresses the thermal interface between the lid portion and the one or more electrical components, thereby forming a thermally-conducting heat path from the one or more electrical components to the heat sink;
   wherein at least one of the resilient fingers includes a generally triangular profile.

12. An apparatus for providing board level EMI shielding and dissipating heat from one or more electrical components of a board, the apparatus comprising:
   a fence including a plurality of walls defining at least one opening along an upper portion of the fence, the plurality of walls configured to be disposed generally about the one or more electrical components;
   a heat sink having resilient fingers connected to a lid portion, the resilient fingers configured to engage openings of at least one of the fence and the board, the lid portion configured to substantially entirely cover the at least one opening of the fence for cooperatively shielding the one or more electrical components within the interior defined by the lid portion and the fence's walls; and
   a thermal interface configured such that engagement of the resilient fingers with the openings compresses the thermal interface between the lid portion and the one or more electrical components, thereby forming a thermally-conducting heat path from the one or more electrical components to the heat sink;
   wherein the fence includes one or more resilient fingers for contacting the underside of the lid portion.

13. The apparatus of claim 12, wherein the fence's resilient fingers includes upwardly bent end portions.

14. The apparatus of claim 13, wherein the upwardly bent end portions are at an angle of about thirty degrees relative to the upper surfaces of the resilient fingers.

15. A method of providing board level EMI shielding and dissipating heat from one or more electrical components of a board, the method comprising:
   positioning a fence relative to the board such that walls of the fence are disposed generally about the one or more electrical components;
   engaging resilient fingers of a heat sink with openings of at least one of the fence and the board;
   substantially entirely covering at least one opening defined along the upper portion of the fence with a lid portion of the heat sink such that the fence and the lid portion cooperatively shield the one or more electrical components within the interior defined by the lid portion and the fence's walls;
   positioning a thermal interface such that engagement of the resilient fingers with the openings compresses the thermal interface between the heat sink and the one or more electrical components, thereby forming a thermally-conducting heat path from the one or more electrical components to the heat sink and;
   contacting an underside of the lid portion with resilient fingers of the fence.

16. The method of claim 15, wherein engaging the resilient fingers includes contacting camming surfaces of the resilient fingers with the fence thereby causing the resilient fingers to move generally outward and allow the resilient fingers to be moved across the fence's walls for engaging the openings.

* * * * *